(12) United States Patent
Sharma (10) Patent No.: US 11,507,128 B1
(45) Date of Patent: Nov. 22, 2022

(54) LOW ON-TIME CONTROL FOR SWITCHING POWER SUPPLY

(71) Applicant: Texas Instruments Incorporated, Dallas, TX (US)

(72) Inventor: Anmol Sharma, Milpitas, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 17/462,081

(22) Filed: Aug. 31, 2021

(51) Int. Cl.
| G06F 1/08 | (2006.01) |
| H03K 5/24 | (2006.01) |
| H03K 3/017 | (2006.01) |
| H03K 3/037 | (2006.01) |

(52) U.S. Cl.
CPC ............. *G06F 1/08* (2013.01); *H03K 3/017* (2013.01); *H03K 3/037* (2013.01); *H03K 5/24* (2013.01)

(58) Field of Classification Search
None
See application file for complete search history.

(56) References Cited

U.S. PATENT DOCUMENTS

| 8,867,237 | B2 * | 10/2014 | Desimone | ........... | H02M 3/3381 363/21.08 |
| 10,008,924 | B1 * | 6/2018 | Turchi | .................... | H02M 7/06 |
| 10,862,388 | B1 * | 12/2020 | Gozzini | ................ | H02M 3/158 |
| 2019/0068054 | A1 * | 2/2019 | Ongaro | .................... | H02M 1/08 |
| 2021/0242774 | A1 * | 8/2021 | Yun | .......................... | H03K 4/48 |
| 2021/0376730 | A1 * | 12/2021 | Yan | ..................... | H02M 3/1584 |
| 2021/0376731 | A1 * | 12/2021 | Bayer | ................. | H02M 1/0025 |

OTHER PUBLICATIONS

Robert Sheehan: "Understanding and Applying Current-Mode Control Theory", Texas Instruments Literature No. SNVA555, Power Electronics Technology Exhibition and Conference Oct. 31, 2007, Hilton Anatole, Dallas, Tx.
Richard Poley and Ali Shirsavar, "Digital Peak Current Mode Control With Slope Compensation Using the TMS320F2803x", Texas Instruments Application Report, SPRABE7A—Apr. 2012.
Brett Novak, "Implementing peak current mode control of a switchmode power supply with a single microcontroller", Texas Instruments White Paper, Jul. 2012.
Sergio Franco, "Slope Compensation in PCMC DC-DC Converters", EDN, edn.com/slope-compensation-in-pcmc-dc-dc-converters/, Mar. 25, 2015.

* cited by examiner

*Primary Examiner* — Cassandra F Cox
(74) *Attorney, Agent, or Firm* — Michael A. Davis, Jr.; Charles A. Brill; Frank D. Cimino (57) ABSTRACT

An electronic device has a modulator circuit, a pulse adjustment circuit, and a pulse generator circuit. The modulator circuit generates a comparator output signal based on a sensed inductor current signal of a power converter, an error amplifier output voltage signal, and a ramp signal to regulate an output voltage signal of the power converter. The pulse adjustment circuit generates an adjusted pulse signal based on the comparator output signal and the error amplifier output voltage signal, and to generate an adjusted clock signal based on an input clock signal and the error amplifier output voltage signal. The pulse generator circuit generates a switching control signal to control a transistor of the power converter based on the adjusted pulse signal and the adjusted clock signal.

20 Claims, 12 Drawing Sheets

LOW ON-TIME CONTROL FOR SWITCHING POWER SUPPLY

BACKGROUND

Peak current mode (PCM) control for buck switching power supplies uses a sensed peak inductor current during the high side switching in a given switching cycle. For low duty cycle operation, the reduced high side on-time makes sensing the inductor current difficult due to limited current sensor speed based on sensor architecture, quiescent current, bandwidth, settling time, etc. Moreover, the high side to low side commutation time depends upon gate driver design, package, printed circuit board parasitics, decoupling capacitors, routing, power transistor parasitics and the like, which becomes important at low duty cycle operation. This makes sensing Inductor current in a small on time further challenging.

SUMMARY

In one aspect, an electronic device includes a modulator circuit, a pulse generator circuit, and a pulse adjustment circuit. The modulator circuit has a feedback input, a current sense input, a comparator output, and a clock output. The pulse generator circuit has a first pulse generator input and a second pulse generator input. The pulse adjustment circuit has an adjustment input, a clock input, a pulse output, and an adjusted clock output. The adjustment input is coupled to the comparator output, the clock input is coupled to the clock output, the pulse output is coupled to the first pulse generator input, and the adjusted clock output is coupled to the second pulse generator input.

In another aspect, an electronic device includes a modulator circuit, a pulse generator circuit, and a pulse adjustment circuit. The modulator circuit is configured to generate a comparator output signal based on a sensed inductor current signal of a power converter, an error amplifier output voltage signal, and a ramp signal to regulate an output voltage signal of the power converter. The pulse adjustment circuit is configured to generate an adjusted pulse signal based on the comparator output signal and the error amplifier output voltage signal, and to generate an adjusted clock signal based on an input clock signal and the error amplifier output voltage signal. The pulse generator circuit is configured to generate a switching control signal to control a transistor of the power converter based on the adjusted pulse signal and the adjusted clock signal.

In a further aspect, a system includes an input, an output, a transistor, an inductor, a modulator circuit, a pulse generator circuit, and a pulse adjustment circuit. The transistor has a first terminal, a second terminal, and a control terminal, where the first terminal of the transistor is coupled to the input, and the second terminal of the transistor is coupled to a switching node. The inductor is coupled between the switching node and the output. The modulator circuit is configured to generate a comparator output signal to regulate an output voltage signal at the output based on a sensed inductor current signal of the inductor, an error amplifier output voltage signal, and a ramp signal. The pulse adjustment circuit is configured to generate an adjusted pulse signal based on the comparator output signal and the error amplifier output voltage signal, and to generate an adjusted clock signal based on an input clock signal and the error amplifier output voltage signal. The pulse generator circuit has a pulse generator output coupled to the control terminal of the transistor. The pulse generator circuit is configured to generate a switching control signal at the pulse generator output to control the transistor based on the adjusted pulse signal and the adjusted clock signal.

DETAILED DESCRIPTION

In the drawings, like reference numerals refer to like elements throughout, and the various features are not necessarily drawn to scale. Also, the term "couple" or "couples" includes indirect or direct electrical or mechanical connection or combinations thereof. For example, if a first device couples to or is coupled with a second device, that connection may be through a direct electrical connection, or through an indirect electrical connection via one or more intervening devices and connections. One or more operational characteristics of various circuits, systems and/or components are hereinafter described in the context of functions which in some cases result from configuration and/or interconnection of various structures when circuitry is powered and operating.

Figure 1:
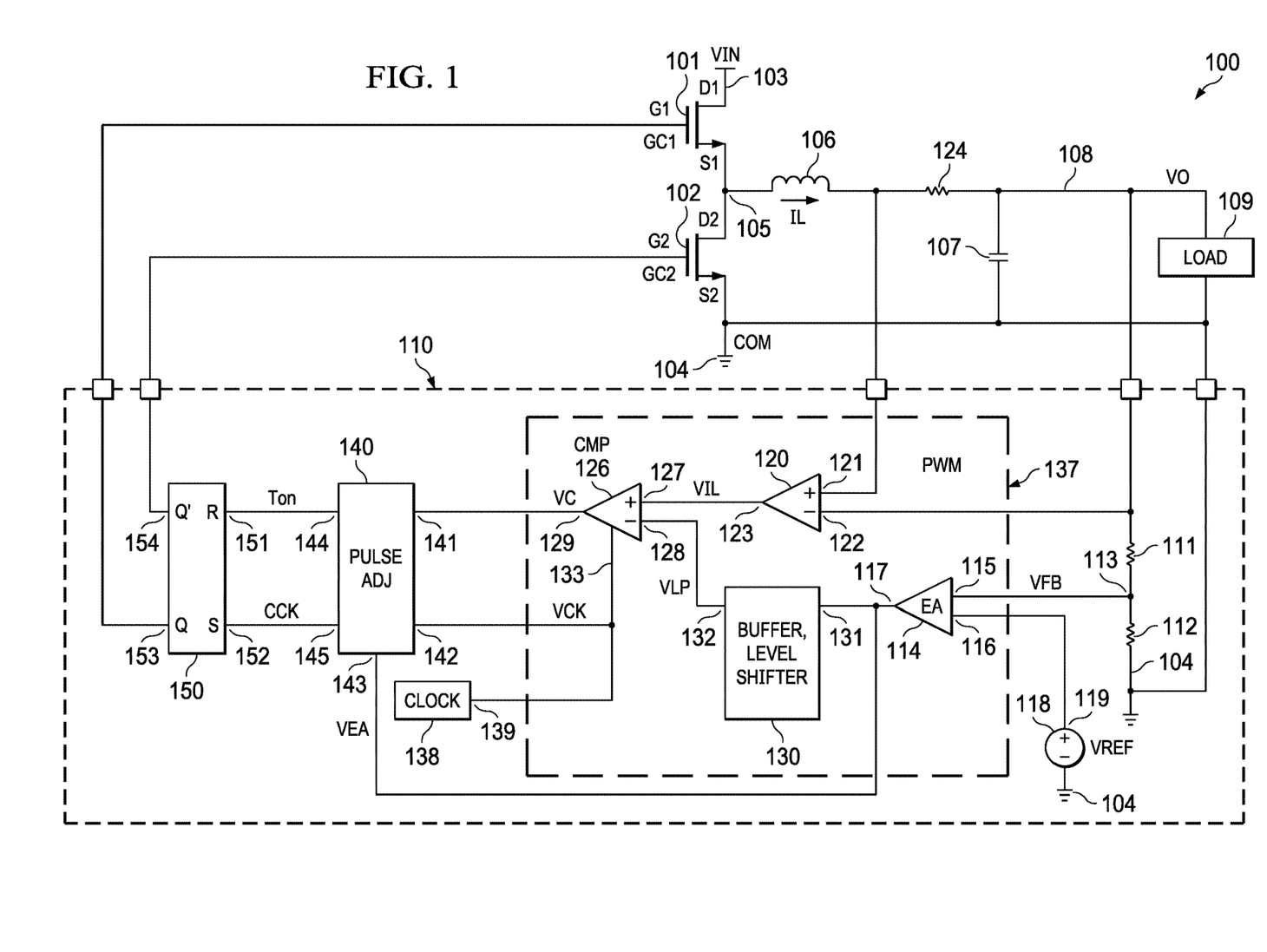
FIG. 1 is a schematic diagram of a power conversion system with a pulse adjustment circuit.

FIG. 1 shows a power conversion system 100, also revered to as a power converter. The system 100 is a buck DC to DC converter that includes a first transistor 101 (e.g., a high side transistor) having a first terminal D1 (e.g., a drain), a second terminal S1 (e.g., a source), and a control terminal G1 (e.g., a gate). The system 100 also includes a second transistor 102 (e.g., a low side transistor) having a first terminal D2 (e.g., a drain), a second terminal S2 (e.g., a source), and a control terminal G2 (e.g., a gate). The first and second transistors 101 and 102 in the illustrated example are n-channel field effect transistors (FETs). Other types of transistors can be used in other implementations, such as bipolar transistors, p-channel transistor's, etc. The first terminal D1 of the first transistor 101 is coupled to an input 103 with an input voltage VIN during powered operation of the system 100. The second terminal S2 of the second transistor 102 is coupled to a reference node 104, such as a circuit ground or common, having a reference voltage COM. In another implementation, the low side transistor 102 is replaced by a diode (not shown) having an anode coupled to the switching node 105 and a cathode coupled to the reference node 104.

The second terminal S1 of the first transistor 101 and the first terminal D2 of the second transistor 102 are coupled to a switching node 105. An inductor 106 has a first terminal coupled to the switching node 105. The second terminal of the inductor 106 is coupled to a first terminal of an output capacitor 107, which is an output 108 of the DC-to-DC converter with an output voltage signal VO during operation of the system 100. In this configuration, the inductor 106 is coupled between the switching node 105 and the output 108.

The second terminal of the output capacitor is coupled to the reference node 104. FIG. 1 shows a load 109 coupled between the output 108 and the reference node 104. In operation, the inductor conducts an inductor current IL that is controlled by the switching operation of the respective first and second transistors 101 and 102.

The system 100 also includes an electronic device 110 (e.g., an integrated circuit) having output terminals coupled to the control terminals G1 and G2 and input terminals for sensing the inductor current IL and the output voltage signal VO. The electronic device 110 has a feedback circuit, for example, a resistive voltage divider that includes a first divider resistor 111 and a second divider resistor 112 coupled in series with one another between the output 108 and the reference node 104. The first divider resistor 111 has a first terminal coupled to the output 108, and a second terminal coupled to a voltage feedback node 113. The second divider resistor 112 has a first terminal coupled to the voltage feedback node 113, and a second terminal coupled to the reference node 104. In operation, when the system 100 is powered, the resistive divider circuit provides an output voltage feedback signal VFB at the voltage feedback node 113, where the voltage feedback signal VFB is proportional to the output voltage signal VO.

The electronic device 110 includes a modulator circuit 137, a pulse adjustment circuit 140, and a pulse generator circuit 150. The modulator circuit 137 includes an error amplifier 114 (labelled "EA"), a feedback input 115, an amplifier 120, a current sense input 121, 122, a comparator 126, a comparator output 129, and a clock input. The feedback input 115 is coupled to the feedback node 113. The current sense input 121, 122 is coupled to a current sensor 124 of the power conversion system 100. The illustrated current sensor is a resistor 124 coupled between the second terminal of the inductor 106 and the output 108. Other forms of current sensors can be used to sense the inductor current IL.

The error amplifier 114 has a first input, a second input 116, and an output 117. The first input of the error amplifier 114 is coupled to the feedback input 115 and the voltage feedback node 113. A voltage reference 118 has an output 119 coupled to the second input 116 of the error amplifier 114. The voltage reference 118 provides a reference voltage VREF at the output 119. In operation, the error amplifier 114 compares the voltage feedback signal VFB to the reference voltage VREF and provides an error amplifier output voltage signal VEA at the output 117. The error amplifier output voltage signal VEA in one example is an analog voltage having an amplitude that is proportional to the difference in the amplitudes of the voltage feedback signal VFB and the reference voltage VREF.

The amplifier 120 in one example is an operational amplifier having a first input, a second input, and an output 123. The first input of the amplifier 120 is coupled to the first current sense input 121, and the second input is coupled to the second current sense input 122. The comparator 126 has a first input 127, a second input 128, and the comparator output 129. The first input 127 of the comparator 126 is coupled to the output 123 of the amplifier 120. In operation, the amplifier 120 generates a voltage signal VIL at the output 123 that is proportional to the inductor current IL and to the voltage across the sense resistor 124.

The example of FIG. 1 includes a buffer or level shifting circuit 130 having an input 131 and an output 132. In this example, the output 117 of the error amplifier 114 is coupled to the second comparator input 128 through the buffer or level shifter circuit 130. The input 131 of the buffer or level shifter circuit 130 in this example is coupled to the output 117 of the error amplifier 114, and the output 132 of the buffer or level shifting circuit 130 is coupled to the second input 128 of the comparator 126. In another implementation, the buffer or level shifter circuit 130 is omitted and the output 117 of the error amplifier 114 is directly coupled to the second input 128 of the comparator 126. In operation, the buffer or level shifter circuit 130 provides a closed loop voltage signal VLP at the second input 128 of the comparator 126. The comparator 126 has a clock input 133 coupled to the output 139 of a clock circuit 138. In operation, the comparator 126 compares the voltage signal VIL to the closed loop voltage signal VLP. The comparator 126 starts the comparison in each clock cycle according to a clock output signal VCK from the clock circuit output 139.

In operation, the comparator 126 of the modulator circuit 137 generates the comparator output signal VC to regulate the output voltage signal VO at the output 108 based on the sensed inductor current signal IL of the inductor 106, and the error amplifier output voltage signal VEA.

The pulse adjustment circuit 140 has an adjustment input 141, a clock input 142, a control input 143, a pulse output 144, and an adjusted clock output 145. The adjustment input 141 is coupled to the comparator output 129. The clock input 142 of the pulse adjustment circuit 140 is coupled to the clock output 139 of the clock circuit 138.

The pulse generator circuit 150 has a first pulse generator input 151, a second pulse generator input 152, a first pulse generator output 153, and a second pulse generator output 154. In one example, the pulse generator circuit 150 is a set-reset (SR) flip flop, the first pulse generator input 151 is a reset input, the second pulse generator input 152 is a set input, the first pulse generator output 153 is a data output (e.g., labeled "Q"), and the second pulse generator output 154 is an inverse data output (e.g., labeled "Q̄"). The pulse output 144 of the pulse adjustment circuit 140 is coupled to the first pulse generator input 151, and the adjusted clock output 145 of the pulse adjustment circuit 140 is coupled to the second pulse generator input 152. The first pulse generator output 153 is coupled to the control terminal G1 of the first transistor 101 and the second pulse generator output 154 is coupled to the control terminal G2 of the second transistor 102.

In operation, when the system 100 is powered and operating, the pulse adjustment circuit 140 generates an adjusted pulse signal Ton based on the comparator output signal VC and the error amplifier output voltage signal VEA. In addition, the pulse adjustment circuit 140 generates an adjusted clock signal CCK based on the input clock signal VCK and the error amplifier output voltage signal VEA. The pulse generator circuit 150 generates a first switching control signal VG1 at the first pulse generator output 153 to control the first transistor 101 based on the adjusted pulse signal Ton and the adjusted clock signal CCK. In addition, the pulse generator circuit 150 generates a second switching control signal VG2 at the second pulse generator output 154 to control the second transistor 102 based on the adjusted pulse signal Ton and the adjusted clock signal CCK.

Figure 1A:
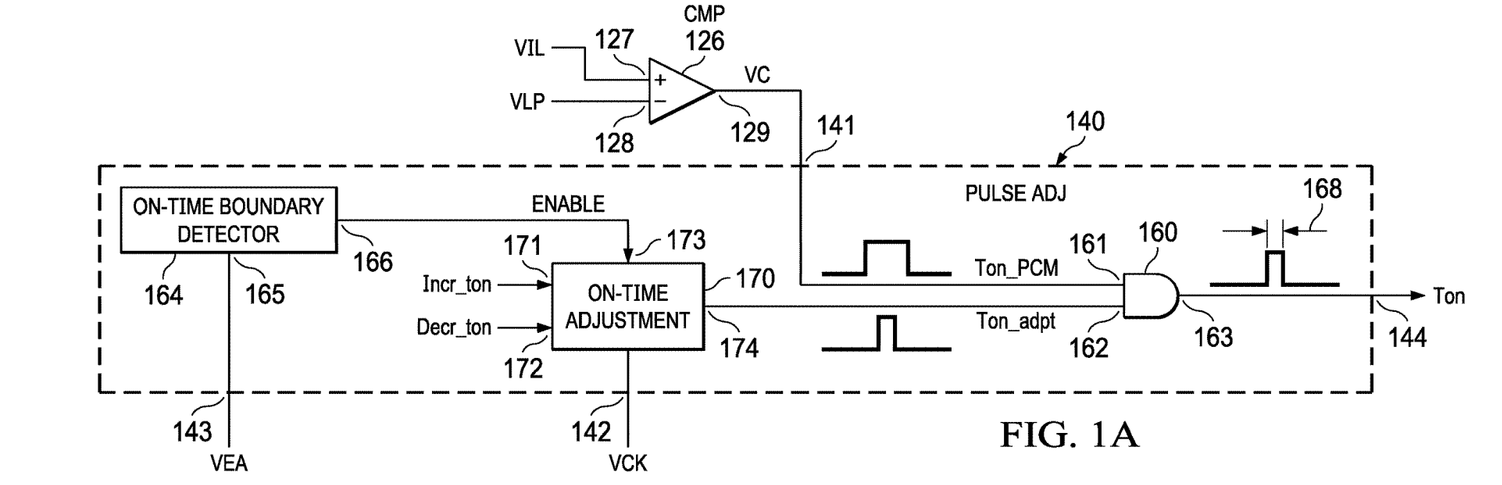
FIG. 1A is a schematic diagram of the pulse adjustment circuit including an on-time adjustment circuit.
Figure 1B:
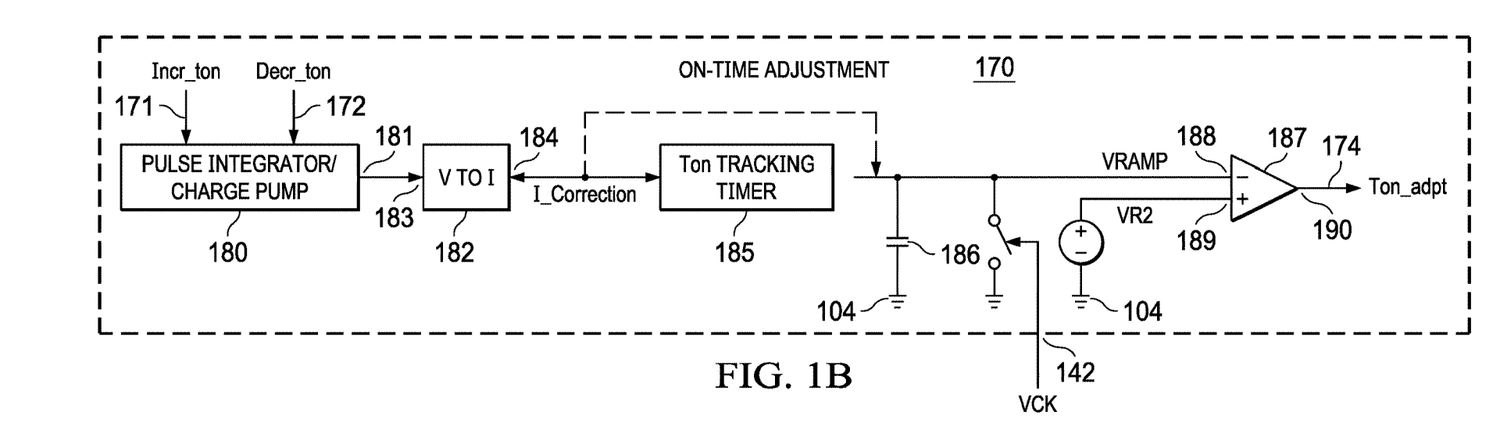
FIG. 1B is a schematic diagram of the on-time adjustment circuit.
Figure 1C:
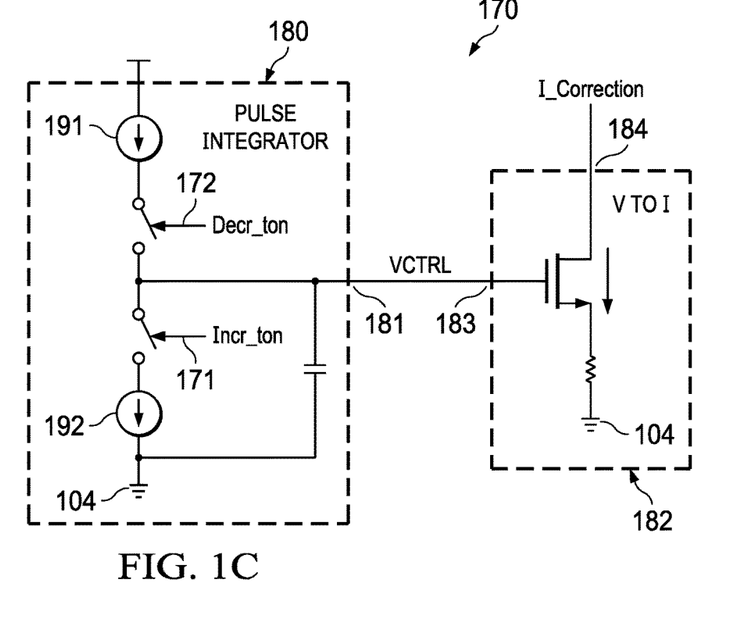
FIG. 1C is a schematic diagram of a pulse integrator in the on-time adjustment circuit.

Referring also to FIGS. 1A, 1B, and 1C, FIG. 1A shows further details of an example implementation of the pulse adjustment circuit 140 including an on-time adjustment circuit 170, As shown in FIG. 1A, the example pulse adjustment circuit 140 includes an AND gate 160, an on-time boundary detector 164, and an on-time adjustment circuit 170. The AND gate has a first gate input 161, a second gate input 162, and a gate output 163. The first gate input 161 is coupled to the comparator output 129. The gate output 163 coupled to the pulse output 144. The on-time boundary detector 164 is a circuit having a detector input 165 and a detector output 166. The detector input 165 is coupled to the control input 143 of the pulse adjustment circuit 140, and to the error amplifier output 117 of FIG. 1. The on-time boundary detector 164 provides an enable signal Enable at the detector output 166 to selectively enable the on-time adjustment circuit 170 responsive to the error amplifier output voltage signal VEA indicating that the adjusted pulse signal Ton is less than a threshold TH.

The on-time adjustment circuit 170 has an increment input 171, a decrement input 172, an enable input 173, and an adjustment output 174. The enable input 173 is coupled to the detector output 165 of the on-time boundary detector 164. The adjustment output 174 is coupled to the second gate input 162 of the AND gate 160.

In operation, when the system 100 is operating, the comparator 126 provides the comparator output signal VC at the comparator output 129 based on comparison of the signals VIL and VLP. The comparator output signal VC provides a pulse control mode on-time input signal Ton_PCM at the first input 161 of the AND gate 160. In addition, the on-time adjustment circuit 170 provides an on-time adjustment or adapt signal Ton_adpt at the adjustment output 174 based on an increment signal Incr_ton at the increment input 171, and a decrement signal Decr_ton at the decrement input 172. The on-time adjustment signal Ton_adpt provides an input to the second gate input 162 of the AND gate 160. The AND gate 160 provides the adjusted pulse signal Ton at the gate output 163 having an on-time 168 that corresponds to the smaller of the on-times of the Ton_PCM and Ton_adpt signals at the respective first and second gate inputs 171 and 172.

FIG. 1B shows further details of an example implementation of the on-time adjustment circuit 170, and FIG. 1C shows further details of an example implementation of a pulse integrator in the on-time adjustment circuit 180. The example on-time adjustment circuit 170 in FIG. 1B includes a pulse integrator (labelled "Pulse Integrator/Charge Pump), a voltage to current converter 182 (labeled "V to I"), an on-time tracking timer 185, a capacitor 186, and an output amplifier 187. The pulse integrator has the increment input 171, the decrement input 172, and a pulse integrator output 181. The pulse integrator adjusts its output voltage to a value which adjusts the on-time to the minimum value needed for steady state operation. The output voltage of the integrator is converted to a current which reduces the on-time proportionately. The on-time tracks/calibrates to a value which maintains an equilibrium at the PCM/VCM (or other mechanism) boundary.

The voltage to current converter 182 has a voltage input 183 and a current output 184. The voltage input 183 is coupled to the pulse integrator output 181. The current output 184 is coupled to an input of the on-time tracking timer 185 and to a first terminal of the capacitor 186. The on-time adjustment circuit 170 also includes a switch coupled in parallel with the capacitor 186 and controlled by the input clock signal VCK to periodically close for discharging the capacitor. The output amplifier 187 has a first input 188, a second input 189, and an output 190. The first input 188 of the output amplifier 187 is coupled to the current output 184. The second input 189 of the output amplifier 187 is coupled to a second voltage reference, and the output 190 of the output amplifier 187 is coupled to the adjustment output 174 of the on-time adjustment circuit 170 to provide the on-time adjustment signal Ton_adpt.

As seen in FIG. 1C, in one example, the pulse integrator includes a charge pump circuit with a first current source 191 that is coupled to the pulse integrator output 181 by a first switch controlled by the decrement signal Decr_ton at the decrement input 172. The charge pump circuit of the on-time adjustment circuit 180 in FIG. 1C also includes a second current source 192 that is coupled to the pulse integrator output 181 by a second switch controlled by the increment signal Incr_ton at the increment input 171. The on-time adjustment circuit 180 also includes a capacitor coupled between the pulse integrator output 181 and the reference node 104. The voltage to current converter 182 in this example includes an and-channel FET having a drain coupled to the current output 184, a gate coupled to the voltage input 183, and a source coupled through a resistor to the reference node 104. As shown in FIG. 1B, the current output 184 of the voltage to current converter 182 is coupled to the capacitor 186 of the on-time adjustment circuit 170.

In operation, the gate voltage vctrl at the voltage input 183 controls the current signal I_Correction at the current output 184 of the voltage to current converter 182, which controls the pulse width of the on-time adjustment signal Ton_adpt at the adjustment output 174. The capacitor of the on-time adjustment circuit 180 integrates the current from the respective current sources 191 and 192, and the voltage of the capacitor increases responsive to current from the first current source 191 and decreases responsive to current sinked from the capacitor by the second current source 192. The on-time adjustment circuit 170 generates the on-time adjustment signal Ton_adpt as a pulse signal having a width equal to a time which starts at the begin of Ton and ends when the comparator 187 trips, where the width is controlled based on the increment signal Incr_ton at the increment input 171, and a decrement signal Decr_ton at the decrement input 172.

Figure 1D:
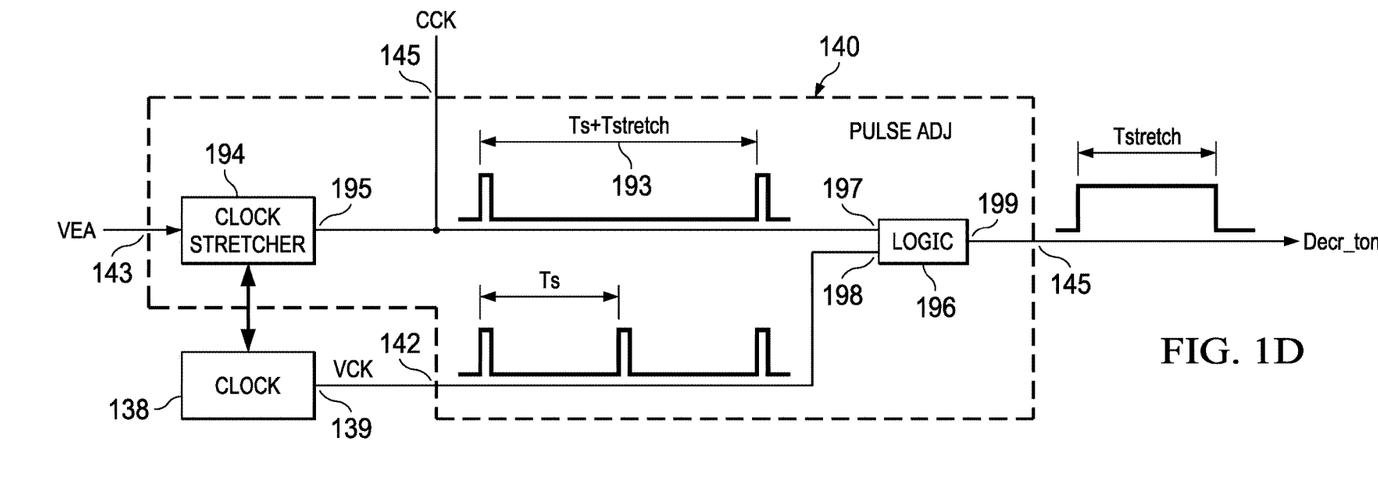
FIG. 1D is a schematic diagram of the pulse adjustment circuit including a clock stretching circuit.

FIG. 1D shows further details of an example implementation of the pulse adjustment circuit 140 including a clock stretching circuit or clock stretcher 194 and a logic circuit 196. The pulse adjustment circuit 140 controls a switching period 193 of the power converter 100 in one mode to a value of the period Ts of the clock signal VCK plus a stretch time Tstretch based on the error amplifier output voltage signal VEA (e.g., Ts=1/Fs, where Fs is the switching frequency of the input clock signal VCK. The pulse adjustment circuit 140 in this example includes the control input 143, which provides the error amplifier output voltage signal VEA to an input of the clock stretcher 194. The clock stretcher 194 has an output 195 that provides the adjusted clock circuit CCK at the output 145. The logic circuit 196 has a first input 197, a second input 198, and an output 199. The logic circuit 196 produces the decrement signal Decr_ton signal at the output 199 having a pulse width Tstretch that the difference of the time periods of its inputs. In another implementation, a second clock circuit (not shown) can generate the Decr_ton signal directly based on the error amplifier output signal VEA. The first input 197 of the logic circuit 196 is coupled to the output 195 of the clock stretcher 194, the second input 198 of the logic circuit 196 is coupled to the clock output 139, and the output 199 of the logic circuit 196 is coupled to the adjusted clock output 145.

In operation, the pulse adjustment circuit 140 stretches the off-time by the time Tstretch by generating the decrement signal Decr_ton with a pulse duration Tstretch that allows the pulse adjustment circuit 140 to regulate Tstretch to go a very small value. Eventually, both the Incr_ton and Decr_ton pulses become substantially the same under equilibrium. The pulse adjustment circuit 140 self-regulates the on-time in the second mode and keeps the system at a boundary condition between PCM and the start of stretching in this example with Tstretch converging toward zero using constant on-time (COT) valley control in one example.

Figure 2:
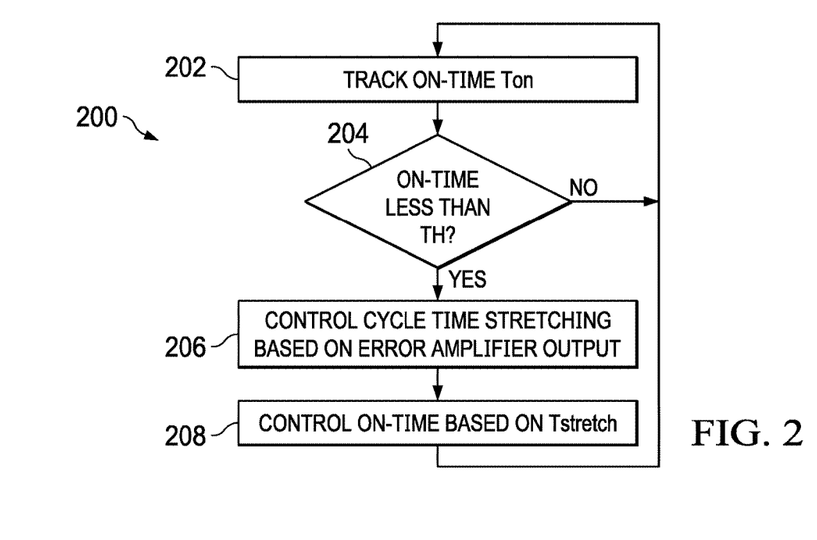
FIG. 2 is a flow diagram of a method.

FIG. 2 shows a method 200 that illustrates example operation of the electronic device 110 of FIGS. 1-1D including the pulse adjustment circuit 140. The pulse adjustment circuit 140 adjusts the switching time period of the adjusted clock signal CCK. Ton is adjusted by the output 144 of the pulse adjustment circuit 140. The pulse adjustment circuit 140 selectively operates in one of a first mode (e.g., normal PCM mode) and a second mode (e.g., STRETCH) based on the clock stretcher 194, which controls the loop decision in Toff phase. Based on the loop decision the off time can become longer by an amount Toff+Tstretch thereby increasing the off time to Ts+Tstretch. In the first mode in a PCM example, the pulse adjustment circuit 140 determines the on-time of the signal Ton based on the error amplifier output voltage signal VEA according to a peak of the sensed inductor current signal IL of the power converter 100. In the second mode, the pulse adjustment circuit 140 determines the off time, and controls the switching period 193 of the power converter 100 based on the measured on-time 168 and the determined off time.

Figure 3:
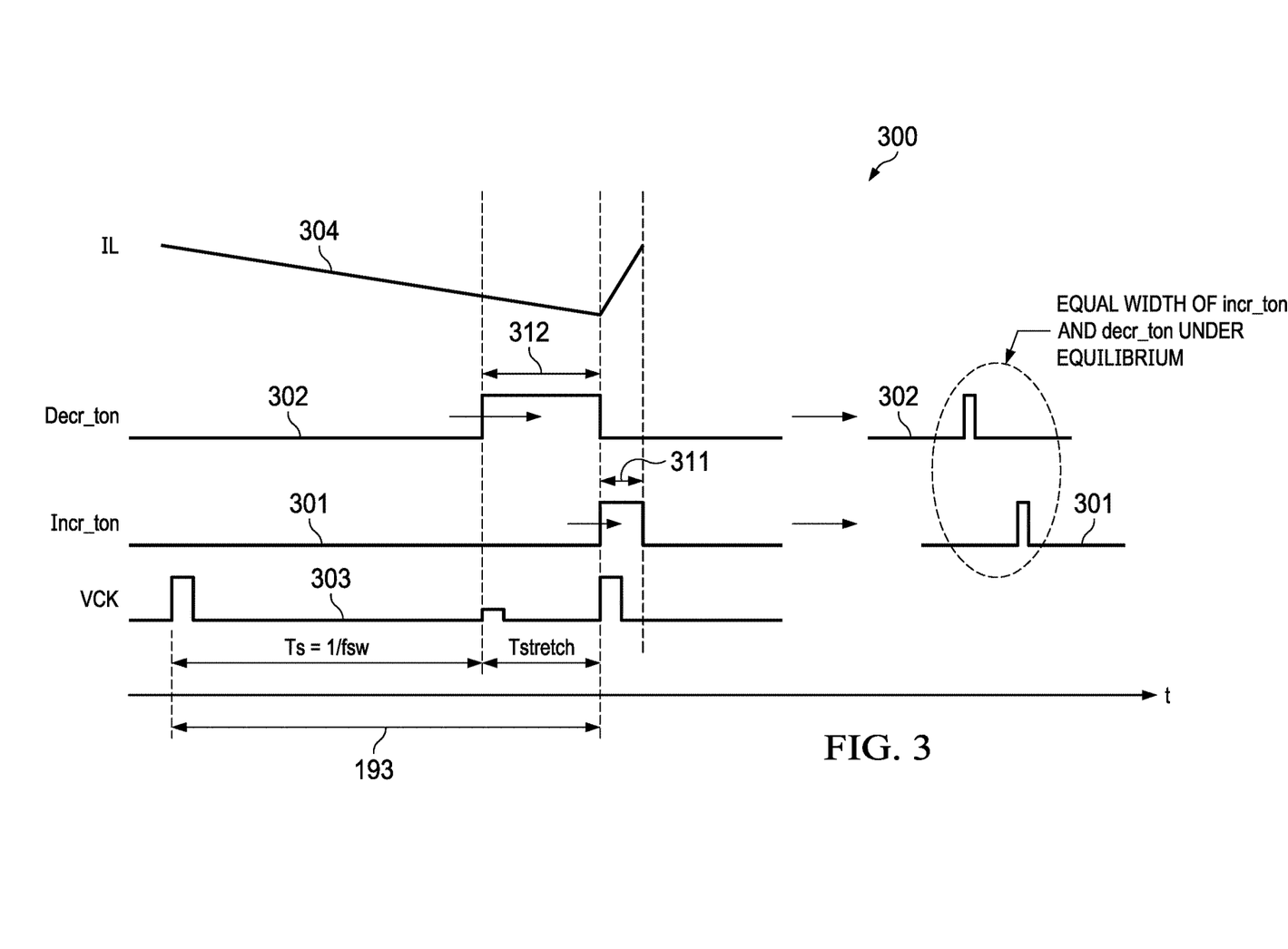
FIGS. 3-12 are signal diagrams of signals in the power conversion system.
Figure 4:
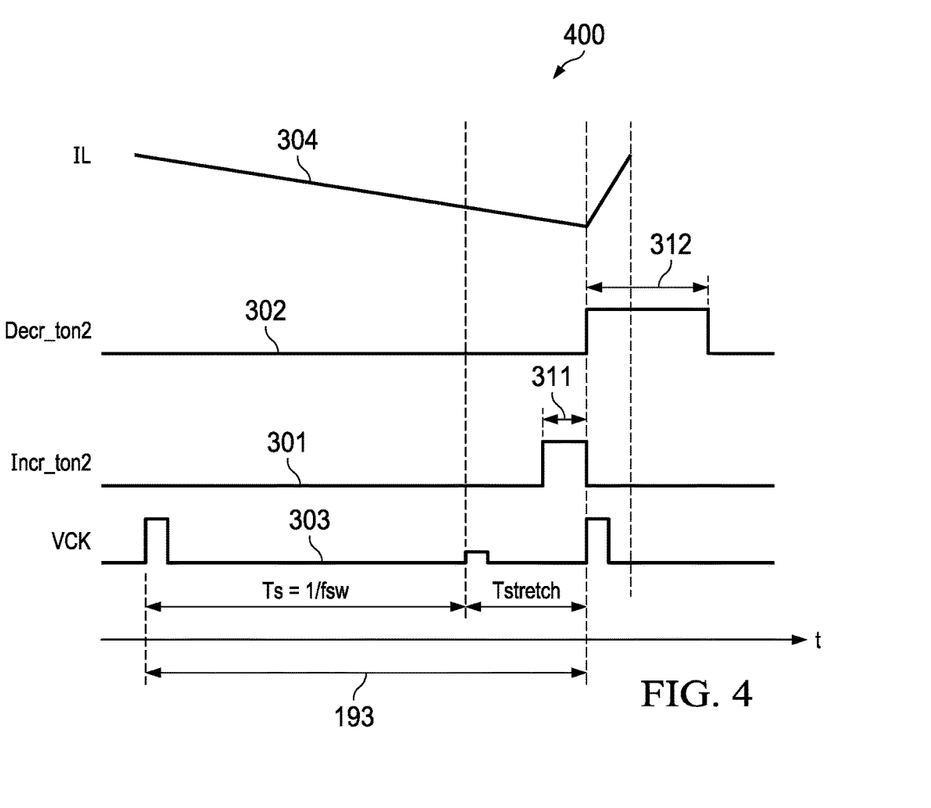

The method 200 begins with operation in the first mode at 202 in FIG. 2, where the on-time adjustment circuit 170 tracks the on-time 168 of the adjusted pulse signal Ton, for example, using the on-time tracking timer 185 in FIG. 1B. The electronic device 110 determines whether the on-time 168 is less than the threshold TH at 204, indicating that clock stretching is needed. If not (NO at 204), the method 200 remains in the first mode and again tracks the on-time 168 at 202. Otherwise (YES at 204, responsive to the on-time 168 being greater than or equal to the threshold TH), the pulse adjustment circuit 140 operates in the second mode at 206 and 208. The pulse adjustment circuit 140 controls the cycle time stretching at 206 based on the error amplifier output voltage signal VEA, for example, by controlling Tstretch using the clock stretcher 194 in FIG. 1D. At 208, in the second mode, the pulse adjustment circuit 140 controls the on-time 168 of the adjusted pulse signal Ton based on the stretch time Tstretch, which is determined according to the error amplifier output voltage signal VEA and a minimum on-time value. In one example, the minimum on-time value is less than or equal to a value that corresponds to the threshold TH. The pulse adjustment circuit 140 then returns to track the on-time 168 of the adjusted pulse signal Ton at 202 and selectively operate and one of the first and second modes based on the threshold comparison at 204 in each switching cycle of the DC-to-DC power conversion system 100. FIGS. 3-12 show signal diagrams of signals in the power conversion system. As shown in FIGS. 3 and 4, in the second mode (STRETCH), the pulse adjustment circuit 140 selectively extends a switching period 193 of the power converter 100 at 206 based on the error amplifier output voltage signal VEA and adjusts the on-time 168 of the adjusted pulse signal Ton based on the width of the decrement signal decr_ton generated by the stretching duration (e.g., the width of the decrement signal Decr_ton is same as the stretch time Tstretch). The charge pump of the on-time adjustment circuit 180 makes the on time reduction proportional to the difference in width Decr_ton−Incr_ton. If Decr_ton width>Incr_ton width, and the on time will reduce in the second mode of on-time reduction outside of the normal PCM mode. Depending upon how the pulses are generated the system could be converted into valley controlled (e.g., COT) system. In one example, the decrement signal Decr_ton pulse is fixed and the increment signal Incr_ton is a pulse within an off-time Toff phase indicating valley sense is not drifting. In each cycle the Toff is not terminated by a valley current mode decision, but the on-time is adjusted to maintain regulation. The illustrated example allows both types of control (e.g., PCM and valley COT) to be implemented by the choicer of the Incr_ton and Decr_ton pulses.

A graph 300 and FIG. 3 illustrates signals in the electronic device 110 and the power converter 100 during operation in the second mode, including a curve 301 that illustrates the increment signal Incr_ton at the increment input 171, a curve 302 that illustrates the decrement signal Decr_ton at the decrement input 172, a curve 303 that illustrates the clock output signal VCK at the clock circuit output 139, and a curve 304 that illustrates the inductor current IL of the inductor 106 as a function of time.

In the illustrated switching cycle, the on-time 168 of the adjusted pulse signal Ton has a duration 311 that is less than the threshold TH, and the pulse adjustment circuit 140 controls the stretch time Tstretch using the clock stretcher 194 to a nonzero value that corresponds to the pulse width 312 of the decrement signal Decr_ton at the decrement input 172. The DC-to-DC power conversion system 100 operates at a duty cycle which corresponds to the closed loop regulation of the output voltage VO under the control of the modulator circuit 137. As further shown in the graph 300, the electronic device 100 ton operates in the second mode to regulate the relative durations of the increment signal Incr_ton and the decrement signal Decr_ton, which will reach equal values at equilibrium and steady state operation of the system 100, absent other changes in the system (e.g., load variations, etc.). As seen in FIG. 3, the width of the decrement signal Decr_ton signal is same as the stretch time Tstretch). The charge pump 180 in one example makes the on time reduction proportional to the width difference Decr_ton−Incr_ton. In normal PCM operation, the circuit 140 determines the normal Ton signal pulse width and the second mechanism determines the reduction of the width of the Ton signal depending upon the net difference (Decr_ton−Incr_ton).

As shown in FIG. 3, the pulse adjustment circuit 140 selectively enforces a minimum on-time, which may be smaller than can be measured by current sensing alone, while allowing extended operating range (e.g., for low loading conditions in the system 100) for very low system operating duty cycle values. The example of FIG. 3 illustrates an implementation in which the pulse of the decrement signal Decr_ton (curve 302) precedes the pulse of the increment signal Incr_ton (curve 301). FIG. 4 shows a graph 400 of the curves 301-304 in another implementation, in which the pulse of the increment signal Incr_ton precedes the pulse of the decrement signal Decr_ton (curve 302). This example also reaches a study state equilibrium at which the durations of the increment signal Incr_ton and the decrement signal Decr_ton are substantially equal. In these examples and other implementations, the electronic device 110 controls the duty cycle of the adjusted pulse signal Ton in the second mode based on the error amplifier output voltage signal VEA to regulate the output voltage signal VO of the power converter 100 based on the reference voltage signal VREF (FIG. 1).

The pulse adjustment circuit 140 regulates or calibrates the duration of the Ton_adpt signal (FIG. 1A) via the increment signal Incr_ton and the decrement signal Decr_ton to a value naturally needed (e.g., not calculated) to regulate the output voltage VO based on the duty cycle set by closed loop regulation of the modulator circuit 137. The electronic device maintains the output voltage regulation even beyond the lowest regulated on-time 168 set by the threshold TH by adaptive on-time control and clock stretching (e.g., a valley control or a Toff control), and different implementations can implement any scheme which controls the Toff to maintain output voltage regulation. The illustrated example regulate Toff (e.g., the point at which the high side first transistor 101 is turned off in each cycle) at the boundary set by the threshold TH, by sensing valley current information as shown in FIG. 3 in the second mode and letting the volt-second balance shrink the on-time 168 of the adjusted pulse signal Ton to keep the duty cycle in regulation. The example implementation adjusts the on-time 168 to solving the problem of minimum measurable on-time for the illustrated pulse control mode (PCM) power conversion system 100 and mitigates the need to sense current in the first transistor 101 for output voltage regulation, while the on-time 168 of the adjusted pulse signal Ton can shrink to maintain fixed frequency operation of the system 100.

Peak current mode converter operation uses sensed inductor current (IL) peak during the high side (HS) phase. As the duty cycle reduces, the high side phase duration (on-time) is reduced, and two components limit how small the on-time can go. The speed of the current sensor and associated circuitry depends upon the sensor design (e.g., sensor architecture, quiescent current Iq, bandwidth BW, settling times, slew rates, etc.). Also, the high-side to low-side commutation time depends upon gate driver design, package, printed circuit board parasitics, decoupling capacitors, routing, and power FET parasitics. The example electronic device 110 facilitates reliable commutation without excessive stresses and mitigates or avoids problems associated with slow current sensing.

In the example electronic device 110, as the duty cycle decreases, the pulse adjustment circuit 140 system remains in the first mode for PCM operation until the threshold is reached, and the pulse adjustment circuit 140 transitions to operation with clock stretching which further leads to a fixed small on-time in the second mode through the charge pump of FIG. 1C. The described examples facilitate regulation of the on-time 168 to any minimum desired value (e.g., 20 ns) to accommodate reliable high-side to low-side commutation. The pulse adjustment circuit 140 regulates the on-time and clock stretching by the signals Incr_ton and Decr_ton) while maintaining output voltage regulation (e.g., using a valley control or a Toff control) using any control scheme which controls the Toff and maintains regulation (e.g., COT control).

Figure 5:
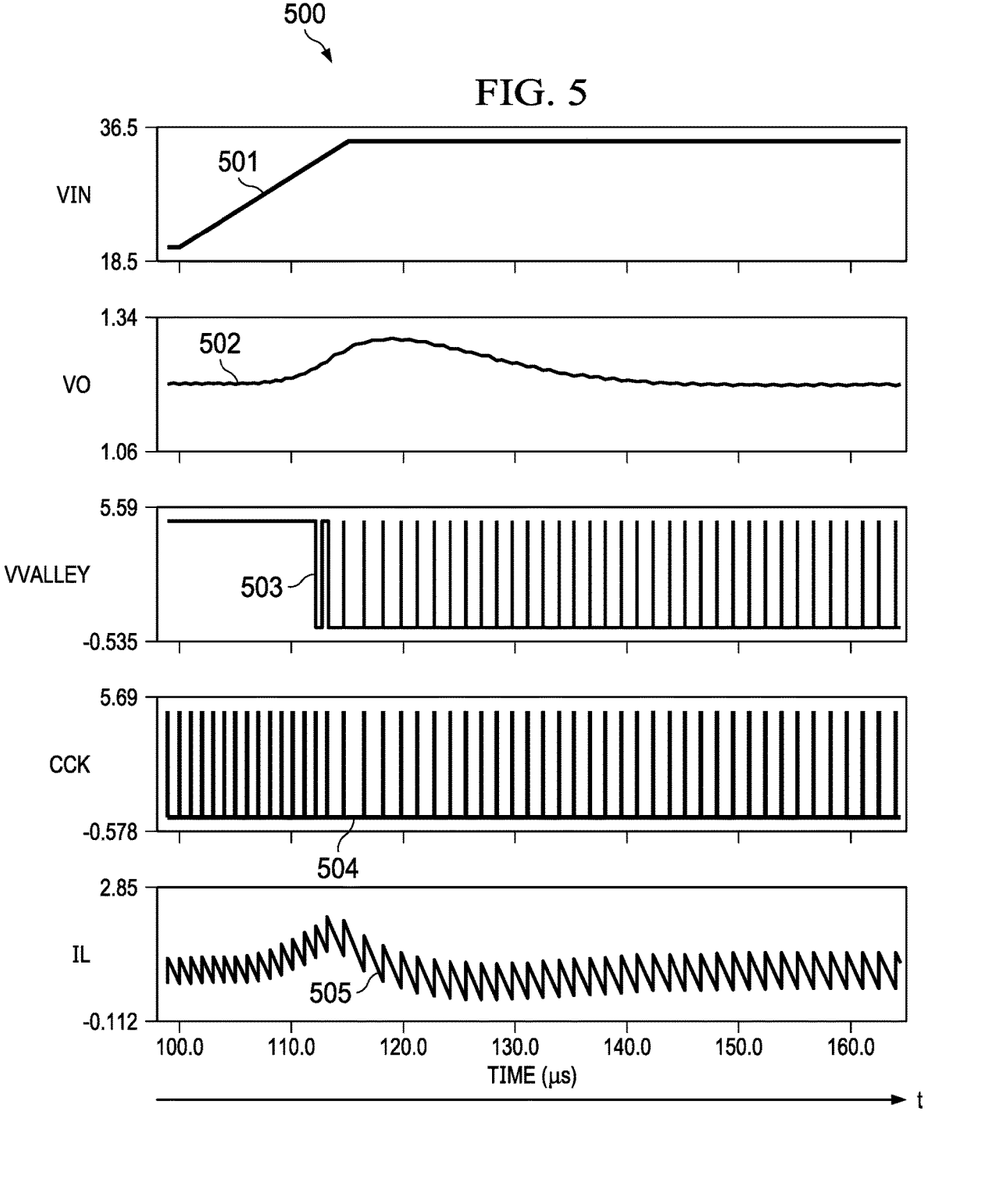
Figure 6:
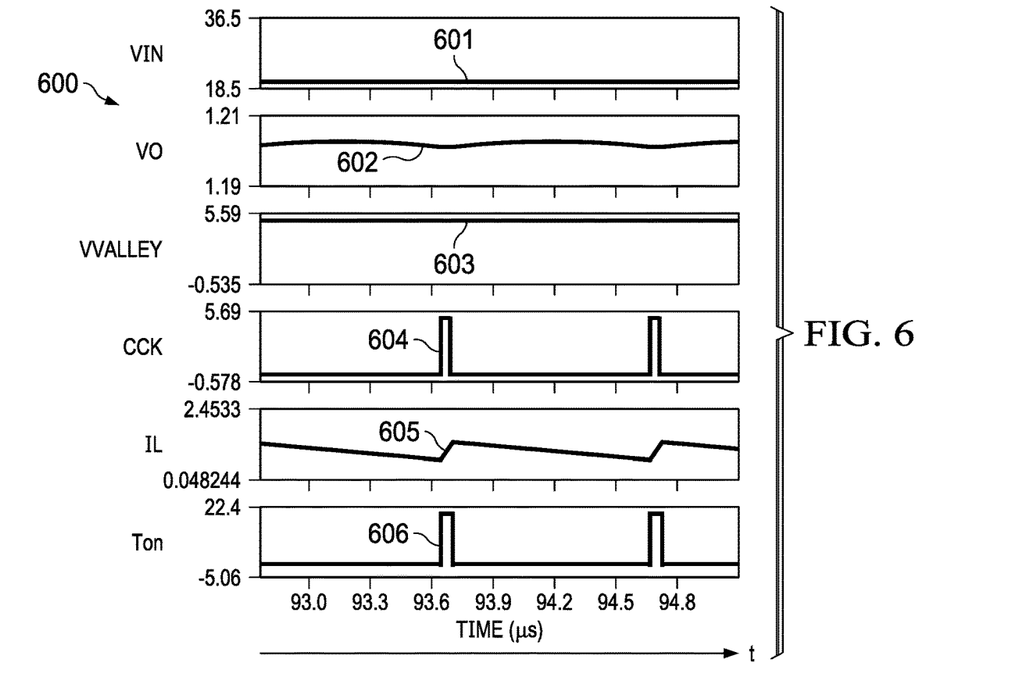
Figure 7:
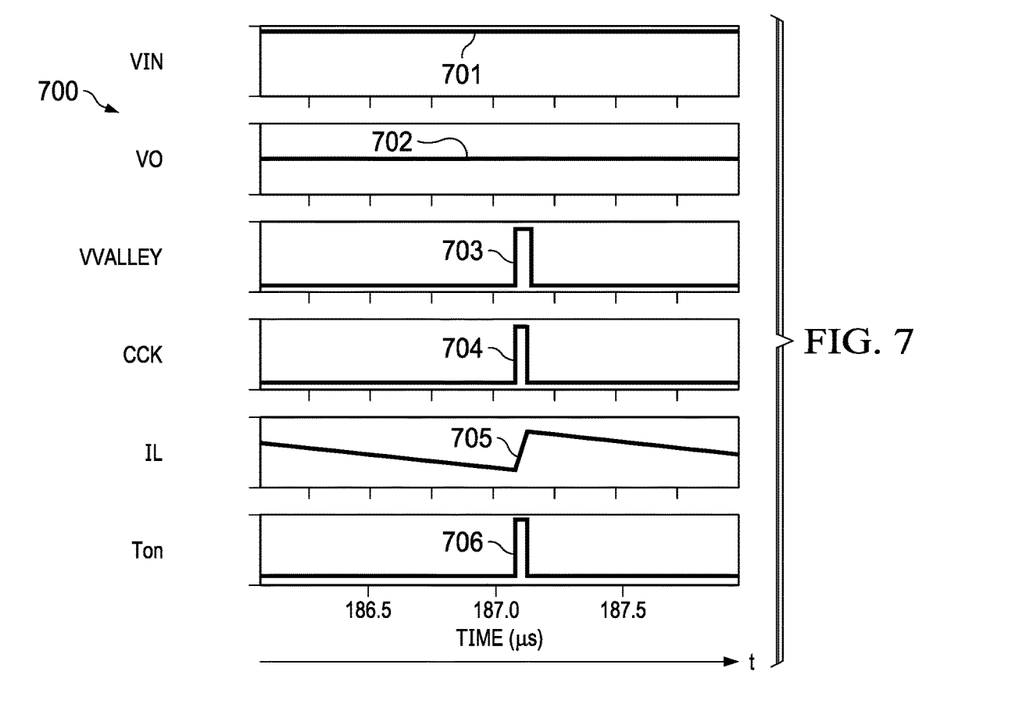

FIGS. 5-7 illustrate transient line step-up simulation results without adaptive on-time tracking. A graph 500 in FIG. 5 includes a curve 501 that shows the input voltage VIN, a curve 502 that shows the output voltage VO, a curve 503 that shows a valley voltage pulse signal VVALLEY indicating the occurrences of valleys and the inductor current IL, a curve 504 that shows the adjusted clock signal CCK, and a curve 505 that shows the inductor current IL for a target output voltage VO of 1.2 V at a switching frequency Fs of approximately 1 MHz. In the graph 500, the input voltage VIN is raised from 20 V to 35 V at a slew rate of 1 V/us, and the system attempts to continue regulation of the output voltage VO. In this example, a sensor decision and blanking limit is set to approximately 50 ns which is below the desired on-time of approximately 35 ns. Without adaptive on-time tracking, the situation can lead to minimum on-times fixed at approximately 50 ns in order to regulate the output voltage VO, and the off-time Toff is increased as shown by the increased switching period from approximately 1 μs to approximately 1.4 μs in the graph 500.

A graph 600 in FIG. 6 includes a curve 601 that shows the input voltage VIN, a curve 602 that shows the output voltage VO, a curve 603 that shows the valley voltage pulse signal VVALLEY, a curve 604 that shows the adjusted clock signal CCK, a curve 605 that shows the inductor current IL, and a curve 606 that shows the adjusted pulse signal Ton prior to an input voltage increase. A graph 700 in FIG. 7 shows a graph 700 illustrating operation after the input voltage VIN is increased, including a curve 701 that shows the input voltage VIN, a curve 702 that shows the output voltage VO, a curve 703 that shows the valley voltage pulse signal VVALLEY, a curve 704 that shows the adjusted clock signal CCK, a curve 705 that shows the inductor current IL, and a curve 706 that shows the adjusted pulse signal Ton.

Figure 8:
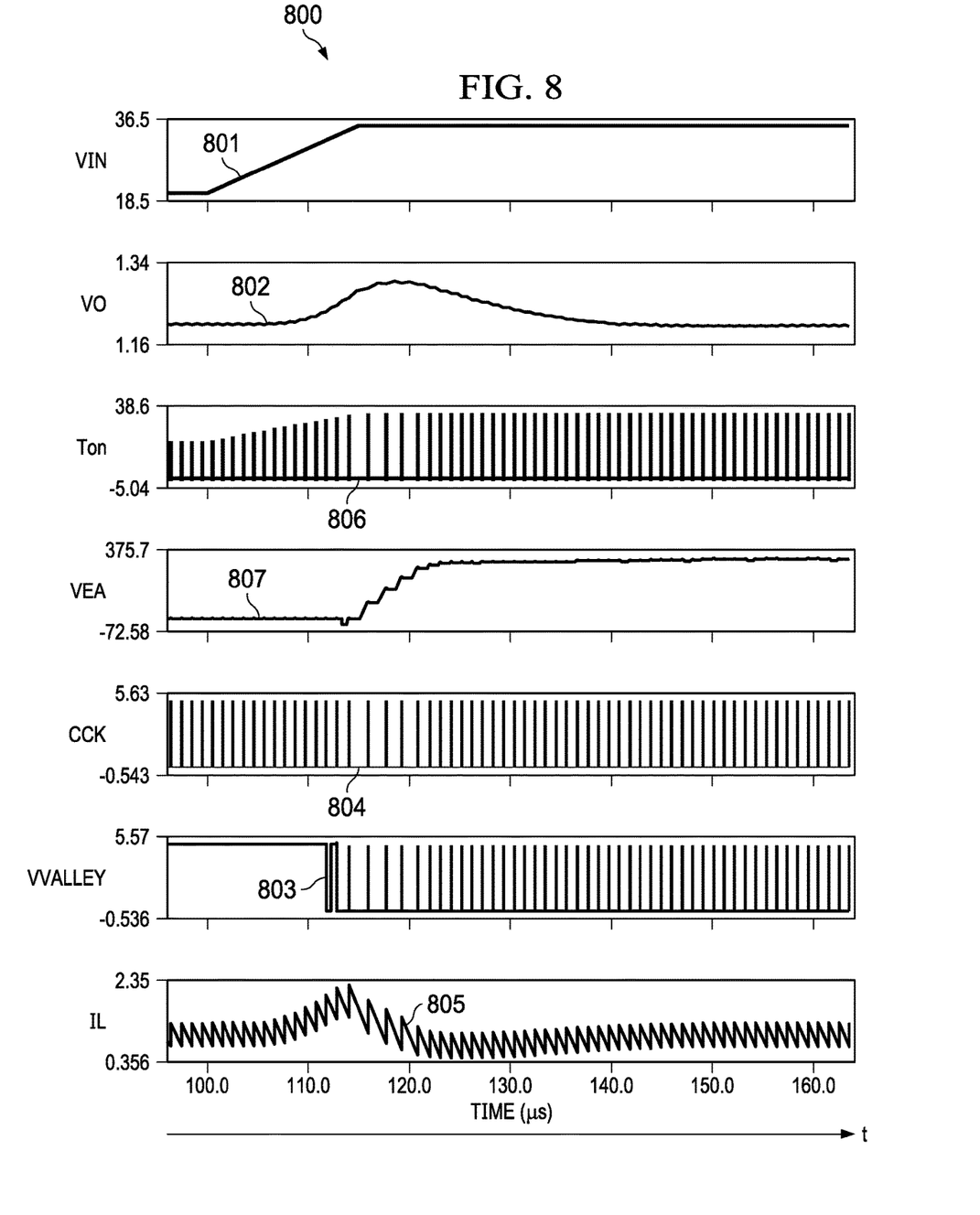
Figure 9:
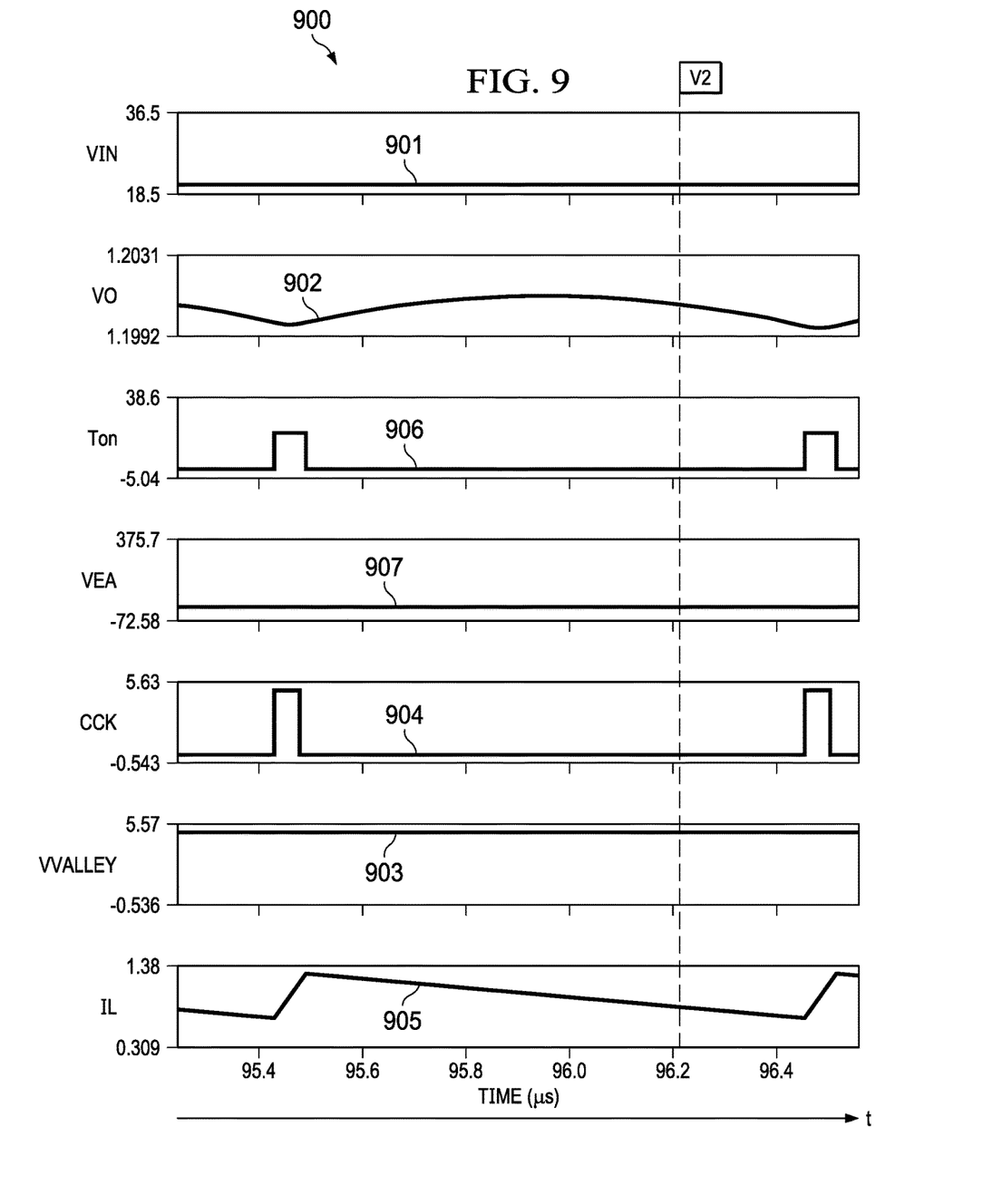
Figure 10:
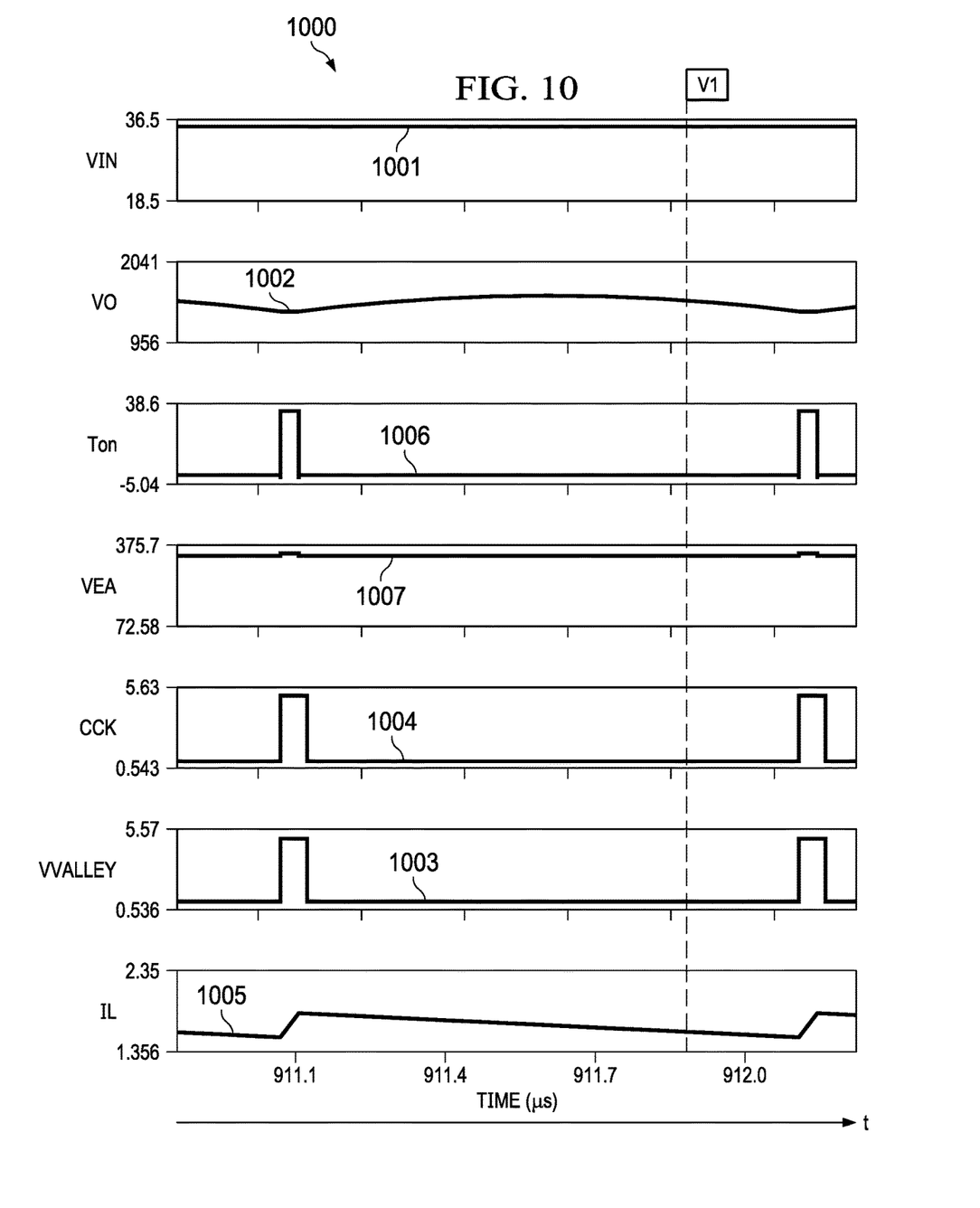

FIGS. 8, 9, and 10 illustrate transient line step-up simulation results with adaptive on-time tracking. A graph 800 in FIG. 8 includes a curve 801 that shows the input voltage VIN, a curve 802 that shows the output voltage VO, a curve 803 that shows a valley voltage pulse signal VVALLEY indicating the occurrences of valleys and the inductor current IL, a curve 804 that shows the adjusted clock signal CCK, a curve 805 that shows the inductor current IL for a target output voltage VO, a curve 806 that shows the adjusted pulse signal Ton, and a curve 807 that shows the error amplifier output voltage VEA for a target output voltage VO of 1.2 V at a switching frequency Fs of approximately 1 MHz. In the graph 800, the input voltage VIN is again raised from 20 V to 35 V at a slew rate of 1 V/us, and the pulse adjustment circuit 140 transitions from the first mode to the second mode while continuing to regulate the output voltage VO. In this example, the pulse adjustment circuit 140 transitions from the first mode to the second mode while continuing to regulate the output voltage VO. In this example, a sensor decision and blanking limit is set to approximately 50 ns which is below the desired on-time of approximately 35 ns.

A graph 900 in FIG. 9 includes a curve 901 that shows the input voltage VIN, a curve 902 that shows the output voltage VO, a curve 903 that shows the valley voltage pulse signal VVALLEY, a curve 904 that shows the adjusted clock signal CCK, a curve 905 that shows the inductor current IL, a curve 906 that shows the adjusted pulse signal Ton prior to an input voltage increase, and a curve 907 that shows the error amplifier output voltage VEA. A graph 1000 in FIG. 10 shows a graph 1000 illustrating operation after the input voltage VIN is increased, including a curve 1001 that shows the input voltage VIN, a curve 1002 that shows the output voltage VO, a curve 1003 that shows the valley voltage pulse signal VVALLEY, a curve 1004 that shows the adjusted clock signal CCK, a curve 1005 that shows the inductor current IL, a curve 1006 that shows the adjusted pulse signal Ton, and a curve 1007 that shows the error amplifier output voltage VEA. The operation of the pulse adjustment circuit 140 in the second mode in this example reduces the on-time 168 of the adjusted pulse signal Ton to the desired value of approximately 35 ns without needing to change the switching frequency.

Figure 11:
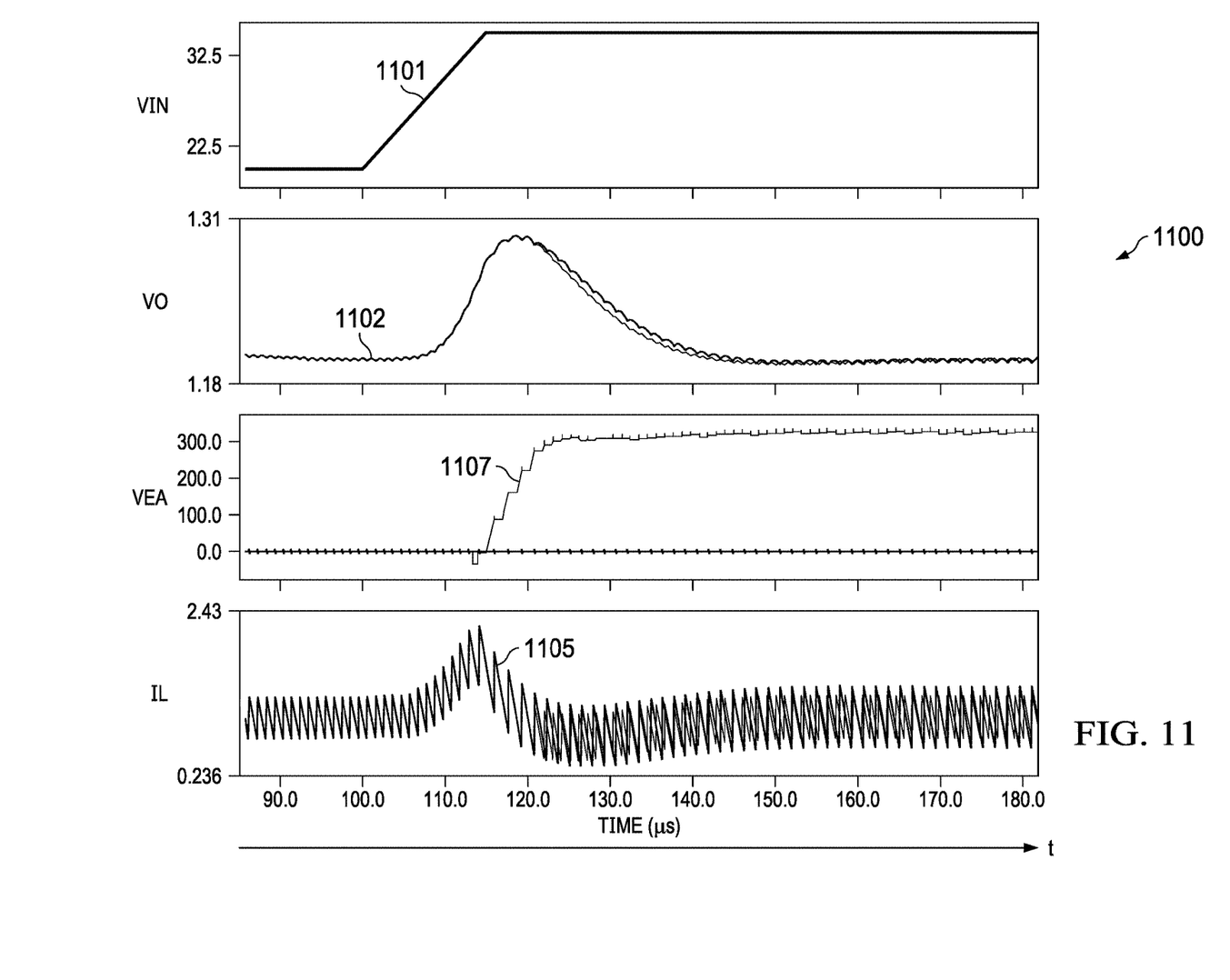
Figure 12:
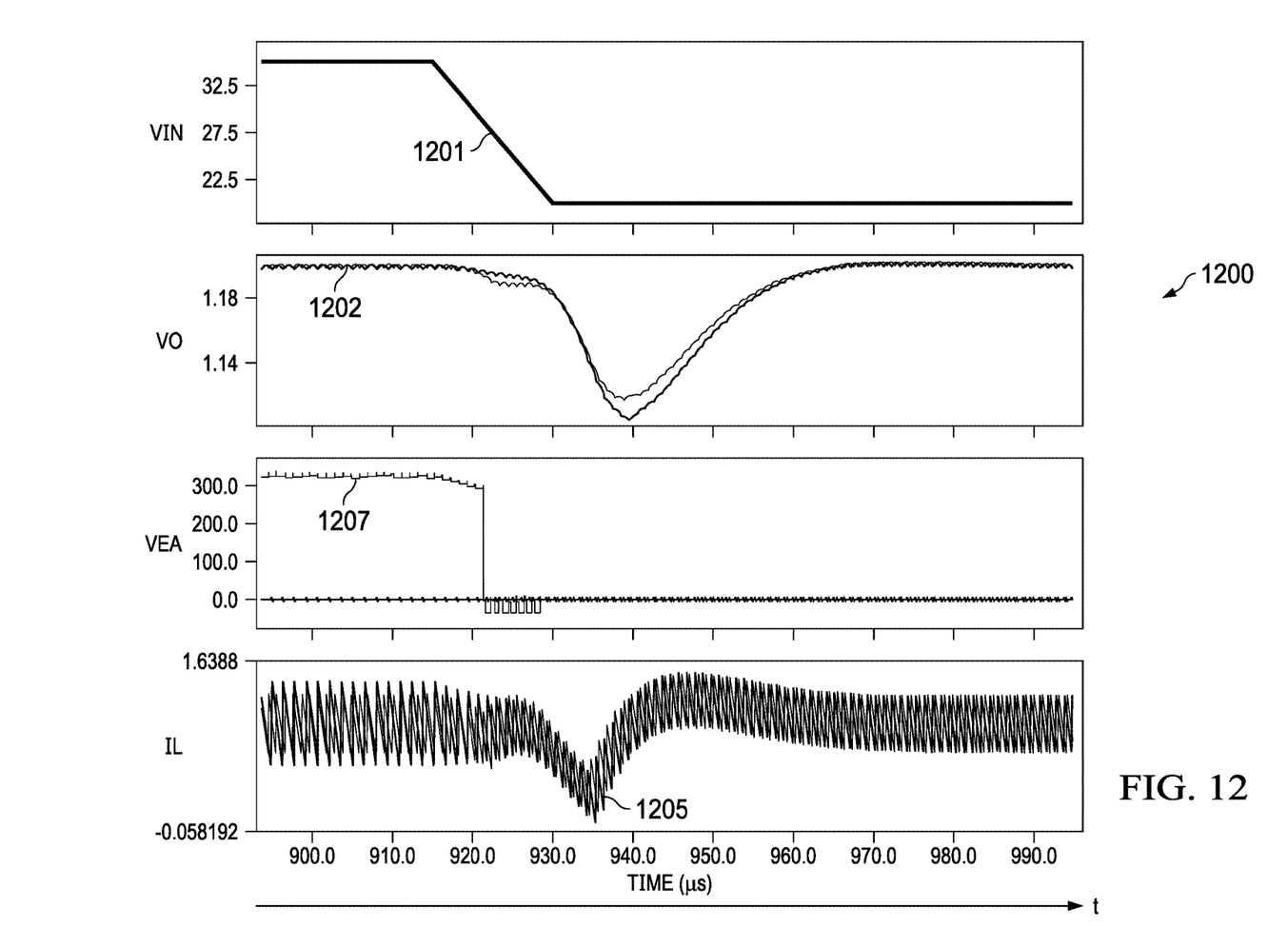

FIGS. 11 and 12 shall comparative simulation results in the system 100 for transient line step-up and stopped-down comparison. A graph 1100 and FIG. 11 includes a curve 1101 that shows the input voltage VIN, a curve 1102 that shows the output voltage VO, a curve 1105 that shows the inductor current IL, and a curve 1107 that shows the error amplifier output voltage VEA for a transient line step-up event. A graph 1200 in FIG. 12 includes a first curve 1201 that shows the input voltage VIN, a curve 1202 that show the output voltage VO, a curve 1205 that shows the inductor current IL, and a curve 1207 that shows the error amplifier output voltage VEA. As seen in FIGS. 11 and 12, the undershoot and overshoot are not impacted by the use of the adaptive on-time tracking, and the results show an improvement in transient due to better tracking of the on-time by the electronic device 110 with loop demand and higher switching frequency. In these examples, the on-time boundary detection in PCM works well with the system 100 able to transition in and out of PCM in response to the simulated line step-up and step-down, respectively. The disclosed example address a fundamental aspect of a buck converter or other switching DC-to-DC converter with high step-down events that result in a small on-time and are applicable to all end equipment where a high step-down converter is used.

Other approaches involve guessing or calculating a peak inductor current, such as emulated current mode ECM control. Further approaches use on-time calculations for COT operation. Another approach uses a different main current loop which is not based on peak current mode control (e.g., valley current mode or voltage mode control). One implementation of the described examples provides an add on second mode to PCM operation in the first mode to selectively achieve a small on-time by tracking mechanism without changing the control architecture. The described examples are independent of package, board and power transistor parasitics, unlike other approaches. In addition, the described examples are robust against process mismatches as the correction adapts to such in closed-loop fashion without folding the switching frequency down, which is advantageous for automotive and other applications. The described solutions can be implemented in a small circuit area and requires no additional testing or trimming during manufacturing.

Modifications are possible in the described examples, and other implementations are possible, within the scope of the claims.

What is claimed is:

1. An electronic device, comprising:
a modulator circuit having a power converter feedback input, a power converter current sense input, a comparator output, and a clock output;
a pulse generator circuit having a first pulse generator input and a second pulse generator input; and
a pulse adjustment circuit having an adjustment input, a clock input, a pulse output, and an adjusted clock output, the adjustment input coupled to the comparator output, the clock input coupled to the clock output, the pulse output coupled to the first pulse generator input, and the adjusted clock output coupled to the second pulse generator input.

2. The electronic device of claim 1, wherein:
the modulator circuit comprises an error amplifier, an amplifier, and a comparator;
the error amplifier has a first error amplifier input, a second error amplifier input, and an error amplifier output, the first error amplifier input is coupled to the power converter feedback input, and the second error amplifier input is coupled to a voltage reference terminal;
the amplifier has an amplifier input and an amplifier output, and the amplifier input is coupled to the power converter current sense input;
the comparator has a first comparator input, a second comparator input, and the comparator output, the first comparator input is coupled to the amplifier output, and the second comparator input is coupled to the error amplifier output.

3. The electronic device of claim 2, wherein:
the pulse adjustment circuit comprises an AND gate, an on-time boundary detector, and an on-time adjustment circuit;
the AND gate has a first gate input, a second gate input, and a gate output, the first gate input is coupled to the comparator output, and the gate output is coupled to the pulse output;
the on-time boundary detector has a detector input and a detector output, and the detector input is coupled to the error amplifier output; and
the on-time adjustment circuit has an increment input, a decrement input, an enable input, and an adjustment output, the enable input is coupled to the detector output, and the adjustment output is coupled to the second gate input.

4. The electronic device of claim 3, wherein:
the on-time adjustment circuit comprises a pulse integrator, a voltage to current converter, a capacitor, and an output amplifier;
the pulse integrator has the increment input, the decrement input, and a pulse integrator output;
the voltage to current converter has a voltage input and a current output, and the voltage input is coupled to the pulse integrator output;
the capacitor has a first terminal coupled to the current output; and
the output amplifier has a first input, a second input, and an output, the first input of the output amplifier is coupled to the current output, the second input of the output amplifier is coupled to a second voltage reference terminal, and the output of the output amplifier is coupled to the adjustment output.

5. The electronic device of claim 4, wherein:
the pulse adjustment circuit comprises a control input and a clock stretcher;
the control input is coupled to the error amplifier output; and
the clock stretcher has an input and an output, the input of the clock stretcher is coupled to the control input, and the output of the clock stretcher is coupled to the pulse output of the pulse adjustment circuit.

6. The electronic device of claim 5, wherein: the pulse generator circuit is a flip-flop; the first pulse generator input is a reset input of the flip-flop; the second pulse generator input is a set input of the flip-flop; and the pulse generator circuit has a transistor control output.

7. The electronic device of claim 1, wherein:
the pulse adjustment circuit comprises a control input and a clock stretcher;
the control input is coupled to the error amplifier output; and
the clock stretcher has an input and an output, the input of the clock stretcher is coupled to the control input, and the output of the clock stretcher is coupled to the pulse output of the pulse adjustment circuit.

8. The electronic device of claim 7, wherein: the pulse generator circuit is a flip-flop; the first pulse generator input is a reset input of the flip-flop; the second pulse generator input is a set input of the flip-flop; and the pulse generator circuit has a transistor control output.

9. The electronic device of claim 1, wherein: the pulse generator circuit is a flip-flop; the first pulse generator input is a reset input of the flip-flop; the second pulse generator input is a set input of the flip-flop; and the pulse generator circuit has a transistor control output.

10. An electronic device, comprising:
a modulator circuit having a comparator output, the modulator circuit configured to provide a power converter regulation signal at the comparator output based on a sensed power converter inductor current, an error amplifier output voltage, and a ramp signal;
a pulse adjustment circuit having first and second outputs, the pulse adjustment circuit configured to provide: an adjusted pulse signal at the first output based on the power converter regulation signal and the error amplifier output voltage; and an adjusted clock signal at the second output based on an input clock signal and the error amplifier output voltage; and
a pulse generator circuit configured to provide a power converter switching signal based on the adjusted pulse signal and the adjusted clock signal.

11. The electronic device of claim 10, wherein the pulse adjustment circuit is configured to:
operate in a first mode responsive to an on-time of the adjusted pulse signal being greater than or equal to a threshold;
operate in a second mode responsive to an on-time of the adjusted pulse signal being less than the threshold;
in the second mode, extend a power converter switching period based on the error amplifier output voltage; and
in the second mode, adjust the on-time of the adjusted pulse signal based on the error amplifier output voltage.

12. The electronic device of claim 11, wherein the pulse adjustment circuit is configured to, in the second mode, control a duty cycle of the adjusted pulse signal based on the error amplifier output voltage and a reference voltage signal.

13. The electronic device of claim 12, the pulse adjustment circuit is configured to, in the second mode:
measure the on-time of the adjusted pulse signal;
determine the duty cycle of the adjusted pulse signal based on the measured on-time of the adjusted pulse signal; and
control the power converter switching period based on the measured on-time and the determined duty cycle of the adjusted pulse signal.

14. The electronic device of claim 11, wherein the pulse adjustment circuit is configured to, in the first mode, adjust the on-time of the adjusted pulse signal based on the error amplifier output voltage and a peak of the sensed power converter inductor current.

15. The electronic device of claim 10, wherein the pulse generator circuit is a flip-flop.

16. A system, comprising:
a transistor having an input terminal, a switching terminal, and a control terminal;
an inductor coupled between the switching terminal and an output terminal;
a modulator circuit having a comparator output, the modulator circuit configured to provide a voltage regulation signal at the comparator output based on a sensed current of the inductor, an error amplifier output voltage, and a ramp signal;
a pulse adjustment circuit having first and second outputs, the pulse adjustment circuit configured to provide: an adjusted pulse signal at the first output based on the voltage regulation signal and the error amplifier output voltage; and an adjusted clock signal at the second output based on an input clock signal and the error amplifier output voltage; and
a pulse generator circuit having a pulse generator output coupled to the control terminal, the pulse generator circuit configured to provide a control signal at the pulse generator output based on the adjusted pulse signal and the adjusted clock signal.

17. The system of claim 16, wherein the pulse adjustment circuit is configured to:
operate in a first mode responsive to an on-time of the adjusted pulse signal being greater than or equal to a threshold;
operate in a second mode responsive to an on-time of the adjusted pulse signal being less than the threshold;
in the second mode, extend a power converter switching period based on the error amplifier output voltage; and
in the second mode, adjust the on-time of the adjusted pulse signal based on the error amplifier output voltage.

18. The system of claim 17, wherein the pulse adjustment circuit is configured to, in the second mode, control a duty cycle of the adjusted pulse signal based on the error amplifier output voltage signal and a reference voltage signal.

19. The system of claim 18, the pulse adjustment circuit is configured to, in the second mode:
measure the on-time of the adjusted pulse signal;
determine the duty cycle of the adjusted pulse signal based on the measured on-time of the adjusted pulse signal; and
control the power converter switching period based on the measured on-time and the determined duty cycle of the adjusted pulse signal.

20. The system of claim 17, wherein the pulse adjustment circuit is configured to, in the first mode, adjust the on-time of the adjusted pulse signal based on the error amplifier output voltage and a peak of the sensed current.

* * * * *